(12) United States Patent
Takahashi

(10) Patent No.: US 12,744,362 B2
(45) Date of Patent: Sep. 22, 2026

(54) FIBER STRUCTURE, OPTICAL COMBINER, LASER LIGHT SOURCE, AND LASER DEVICE

(71) Applicant: Fujikura Ltd., Tokyo (JP)

(72) Inventor: Akari Takahashi, Sakura (JP)

(73) Assignee: Fujikura Ltd., Tokyo (JP)

( * ) Notice: Subject to any disclaimer, the term of this patent is extended or adjusted under 35 U.S.C. 154(b) by 1118 days.

(21) Appl. No.: 17/790,671

(22) PCT Filed: Dec. 6, 2020

(86) PCT No.: PCT/JP2020/045358
§ 371 (c)(1),
(2) Date: Jul. 1, 2022

(87) PCT Pub. No.: WO2021/166380
PCT Pub. Date: Aug. 26, 2021

(65) Prior Publication Data

US 2023/0056098 A1 Feb. 23, 2023

(30) Foreign Application Priority Data

Feb. 17, 2020 (JP) ................................ 2020-024543

(51) Int. Cl.
*H04B 10/00* (2013.01)
*H01S 5/40* (2006.01)

(52) U.S. Cl.
CPC .................................. *H01S 5/4012* (2013.01)

(58) Field of Classification Search
CPC ................. H01S 5/4012; H01S 3/0675; H01S 3/094003; H01S 3/1618; G02B 6/4296; G02B 6/255
See application file for complete search history.

(56) References Cited

U.S. PATENT DOCUMENTS 4,753,515 A * 6/1988 Sato ..................... G02B 6/3801 385/59
5,463,708 A * 10/1995 Yui ..................... G02B 6/4248 385/49

(Continued)

FOREIGN PATENT DOCUMENTS

CN 106405737 A 2/2017
EP 1312659 A1 5/2003

(Continued)

OTHER PUBLICATIONS

International Preliminary Report on Patentability issued in corresponding International Application No. PCT/JP2020/045358 mailed Sep. 1, 2022 (12 pages).

(Continued)

*Primary Examiner* — Agustin Bello
(74) *Attorney, Agent, or Firm* — Osha Bergman Watanabe & Burton LLP

(57) ABSTRACT

A fiber structure includes a covering part, the covering part having an optical fiber strand and a coating covering the optical fiber strand; a strand exposed part adjacent to the covering part, the strand exposed part including an exposed optical fiber strand, and a sealing part covering a boundary between the covering part and the strand exposed part. The sealing part including a fluororesin having a structure represented by formula (1):

(1)

(Continued)

where R represents a divalent organic fluorine compound group, and n represents an integer of 1 or more.

11 Claims, 10 Drawing Sheets

(56) References Cited

U.S. PATENT DOCUMENTS

| | | | | |
|---|---|---|---|---|
| 9,417,391 | B2 * | 8/2016 | Tanaka | G02B 6/2856 |
| 9,612,399 | B2 * | 4/2017 | Noguchi | H01S 3/0071 |
| 9,759,866 | B2 * | 9/2017 | Tanaka | H01S 5/4012 |
| 10,073,220 | B2 * | 9/2018 | Fujita | G02B 6/287 |
| 10,218,142 | B1 * | 2/2019 | Hsia | H01S 3/0407 |
| 11,703,647 | B2 * | 7/2023 | Matsumoto | G02B 6/3889<br>385/78 |
| 12,447,553 | B2 * | 10/2025 | Kangastupa | B23K 26/0096 |
| 2009/0110008 | A1 * | 4/2009 | Dong | G02B 6/2856<br>372/6 |
| 2012/0206793 | A1 * | 8/2012 | Tanaka | G02B 6/2804<br>359/341.3 |
| 2014/0205236 | A1 * | 7/2014 | Noguchi | G02B 6/2835<br>385/33 |
| 2016/0154182 | A1 * | 6/2016 | Noguchi | G02B 6/06<br>385/96 |
| 2017/0235055 | A1 * | 8/2017 | Fujita | G02B 27/0994<br>385/24 |
| 2019/0113702 | A1 * | 4/2019 | Fujita | G02B 6/4432 |
| 2019/0146157 | A1 * | 5/2019 | Fujita | G02B 6/287<br>385/43 |
| 2020/0292761 | A1 * | 9/2020 | Nakazato | G02B 6/2558 |
| 2021/0257805 | A1 * | 8/2021 | Takahashi | H01S 5/0239 |
| 2022/0269018 | A1 * | 8/2022 | Matsumoto | G02B 6/3889 |
| 2022/0269095 | A1 * | 8/2022 | Matsumoto | H01S 3/094003 |
| 2023/0056098 | A1 * | 2/2023 | Takahashi | H01S 5/4012 |

FOREIGN PATENT DOCUMENTS

| | | | | | |
|---|---|---|---|---|---|
| EP | 3439432 | A1 | | 2/2019 | |
| EP | 3444647 | A1 | | 2/2019 | |
| JP | 2006039273 | A | | 2/2006 | |
| JP | 2009-158656 | A | | 7/2009 | |
| JP | 2017-187554 | A | | 10/2017 | |
| JP | 2017-191298 | A | | 10/2017 | |
| JP | 2017191261 | A | * | 10/2017 | G02B 6/2551 |
| JP | 2017-224678 | A | | 12/2017 | |
| WO | 2017/169536 | A1 | | 10/2017 | |

OTHER PUBLICATIONS

Extended European Search Report issued in European Application No. 20920356.1, dated Oct. 11, 2023 (9 pages).

* cited by examiner

FIBER STRUCTURE, OPTICAL COMBINER, LASER LIGHT SOURCE, AND LASER DEVICE

TECHNICAL FIELD

One or more embodiments of the present invention relate to a fiber structure, an optical combiner, and a laser device.

BACKGROUND

In a laser light source such as a high output fiber laser, an optical combiner which makes excitation light from a plurality of light sources multiplex and enter into an optical resonance part is generally used.

The optical combiner includes a first optical fiber part having a plurality of optical fiber strands and a second optical fiber part having one optical fiber strand. The first optical fiber part and the second optical fiber part each have a covering part and a strand exposed part adjacent to the covering part. The covering part has an optical fiber strand and a coating thereof, and the strand exposed part has an exposed optical fiber strand. The end face of the strand exposed part of the first optical fiber part and the end face of the strand exposed part of the second optical fiber part are fusion-spliced.

As such an optical combiner, for example, one disclosed in Patent Document 1 below is known. In the document, it is disclosed that a boundary between the strand exposed part and the covering part is covered by a sealing part in order to suppress the deterioration of the optical characteristics of the optical fiber due to the entry of moisture into the boundary between the strand exposed part and the covering part.

Patent Document 1: JP2017-191298A

However, the optical combiner described in the Patent Document 1 has room for improvement in terms of durability.

SUMMARY

One or more embodiments of the present invention provide a fiber structure, an optical combiner, a laser light source, and a laser device capable of improving durability.

The present inventors have noticed that when high-output light is made incident on the optical combiner in a case where the sealing part is composed of, for example, an acrylic resin in the optical combiner, the sealing part becomes hot together with the lapse of time. As a result, the present inventors wondered if when high-output light is made incident on the optical combiner for a long time in a case where an acrylic resin is used as the sealing part, the light is easily absorbed with the lapse of time, and as a result, the sealing part becomes hot with the lapse of time. As a result of further intensive studies, the present inventors have found that, in an optical combiner, a sealing part covering a boundary between a strand exposed part and a covering part is made of a fluororesin having a specific structure instead of an acrylic resin.

That is, one or more embodiments of the present invention provide a fiber structure including a covering part, the covering part including an optical fiber strand and a coating covering the optical fiber strand, a strand exposed part adjacent to the covering part, the strand exposed part including an exposed optical fiber strand, and a sealing part covering a boundary between the covering part and the strand exposed part, the sealing part including a fluororesin having a structure represented by the following formula (1):

(1)

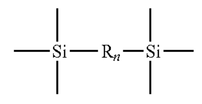

(In the formula (1), R represents a divalent organic fluorine compound group, and n represents an integer of 1 or more.)

According to the fiber structure, the sealing part has a structure represented by the formula (1). Therefore, for example, even if high-output light is made incident on the optical fiber strand of the covering part and high output light leaked from the optical fiber strand is made incident on the sealing part for a long time, the absorption of light by the sealing part is suppressed as compared with the case of using the acrylic resin as the sealing part. Therefore, thermal deterioration due to temperature rise of the sealing part is suppressed, and deterioration of sealing performance of the sealing part is suppressed. Therefore, the moisture enters from the boundary between the strand exposed part and the covering part, and the optical fiber strand is pressed by the swelling of the coating due to the moisture to suppress the deterioration of the optical characteristics of the optical fiber strand. Thus, according to the fiber structure of one or more embodiments of the present invention, durability can be improved.

In the fiber structure, the divalent organic fluorine compound group may be represented by the following formula (A).

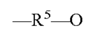

(In the formula (A), $R^5$ represents a fluorinated alkylene group having 1 to 5 carbon atoms.)

In this case, since the sealing part has an Si—O bond having a bonding energy larger than that of a C—C bond or a C—H bond, the heat resistance of the sealing part is further improved, and the durability of the fiber structure can be further improved.

In the fiber structure, the fluorinated alkylene group may be $—CF_2—CF(CF_3)—$, $—CF_2—$, $—CF_2—CF_2—$ or $—CF_2—CF_2—CF_2—$.

In this case, since the sealing part has an Si—O bond and a C—F bond having a bonding energy larger than that of a C—C bond or a C—H bond, the heat resistance of the sealing part is further improved, and the durability of the fiber structure can be further improved.

In the fiber structure, the optical fiber strand may include a core and a clad surrounding the core, and a refractive index of the sealing part be smaller than a refractive index of the clad.

In this case, the laser light can be effectively confined in the optical fiber strand.

In addition, one or more embodiments of the present invention provide an optical combiner, which includes a first fiber structure and a second fiber structure, in which the first fiber structure and the second fiber structure are composed of the fiber structure described above, in which in the first fiber structure, the covering part and the strand exposed part have a plurality of the optical fiber strands, in which in the second fiber structure, the covering part and the strand exposed part have one optical fiber strand, and an end face of the strand exposed part of the first fiber structure and an end face of the strand exposed part of the second fiber structure are fusion-spliced.

According to the optical combiner, sealing parts of the first fiber structure and the second fiber structure have a structure represented by the formula (1). Therefore, for example, even if high-output light is made incident on the optical fiber strand of the covering part and the light leaked from the optical fiber strand is made incident on the sealing part for a long time, the absorption of light by the sealing part is suppressed as compared with the case where the acrylic resin is used as the sealing part. Therefore, since thermal deterioration due to temperature rise of the sealing part is suppressed, the durability of the first fiber structure and the second fiber structure can be improved. Therefore, the durability of the optical combiner of one or more embodiments of the present invention can be improved.

In the optical combiner, the sealing part may have a Young's modulus of 10 MPa or less.

In this case, when the light is made incident on the first fiber structure of the optical combiner and is emitted from the second fiber structure of the optical combiner, the beam quality of the emitted light can be further improved as compared with the case where the Young's modulus of the sealing part exceeds 10 MPa.

In one or more embodiments, the optical combiner further include a housing part housing the first fiber structure and the second fiber structure, a first fixing part fixing the first fiber structure to the housing part, and a second fixing part fixing the second fiber structure to the housing part, in which in the first fiber structure, the first fixing part is adhered to the sealing part, and in which in the second fiber structure, the second fixing part is adhered to the sealing part, and in which the first fixing part and the second fixing part each have an adhesive strength larger than that of the sealing part with respect to the housing part.

In this case, the first fiber structure and the second fiber structure are fixed to the housing part by the first fixing part and the second fixing part each having an adhesive strength larger than that of the sealing part with respect to the housing part, thereby reinforcing the fixing of the first fiber structure and the second fiber structure to the housing part. Thus, separation between the first fiber structure and the second fiber structure and the housing part can be suppressed.

In the optical combiner, the sealing part of the first fiber structure may be fixed to the housing part, and the sealing part of the second fiber structure may be fixed to the housing part.

In this case, the adhesive strength between the first fiber structure and the housing part as well as the adhesive strength between the second fiber structure and the housing part can be further improved.

In addition, one or more embodiments of the present invention provide a laser light source including the optical combiner, an optical resonance part emitting light of a specific wavelength as a laser light on the basis of light emitted from the optical fiber strand of the second fiber structure of the optical combiner, an excitation light source making excitation light incident on each of a plurality of the optical fiber strands of the first fiber structure of the optical combiner.

According to the laser light source, excitation light is made incident on each of the plurality of optical fiber strands of the first fiber structure of the optical combiner from the excitation light source, and light of a specific wavelength is emitted from the optical resonance part as a laser light on the basis of the light emitted from the optical fiber strand of the second fiber structure of the optical combiner. At this time, even if output of the excitation light incident on the optical combiner is high, the durability of the optical combiner can be improved. Therefore, the durability of the laser light source of one or more embodiments of the present invention can be improved.

Further, one or more embodiments of the present invention provide a laser device including a plurality of laser light sources, and an optical combiner coupling and emitting a laser light made incident from the plurality of laser light sources, in which the optical combiner includes the optical combiner described above.

According to this laser device, a laser light is made incident on the first fiber structure of the optical combiner from a plurality of laser light sources, coupled and emitted as a laser light from the second fiber structure. At this time, the optical combiner is composed of the optical combiner described above, and durability can be improved. Therefore, the durability of the laser device of one or more embodiments of the present invention can be improved.

In the laser device, the laser light source may include the laser light source described above.

In this case, the laser light source is composed of the laser light source described above and has an optical combiner capable of improving durability. Therefore, the laser device of one or more embodiments of the present invention can further improve the durability.

In one or more embodiments of the present invention, the refractive index refers to a refractive index in a wavelength of light made incident on the optical fiber strand.

According to one or more embodiments of the present invention, provided are a fiber structure, an optical combiner, a laser light source, and a laser device capable of improving durability.

DETAILED DESCRIPTION

<Optical Combiner>

Figure 1:
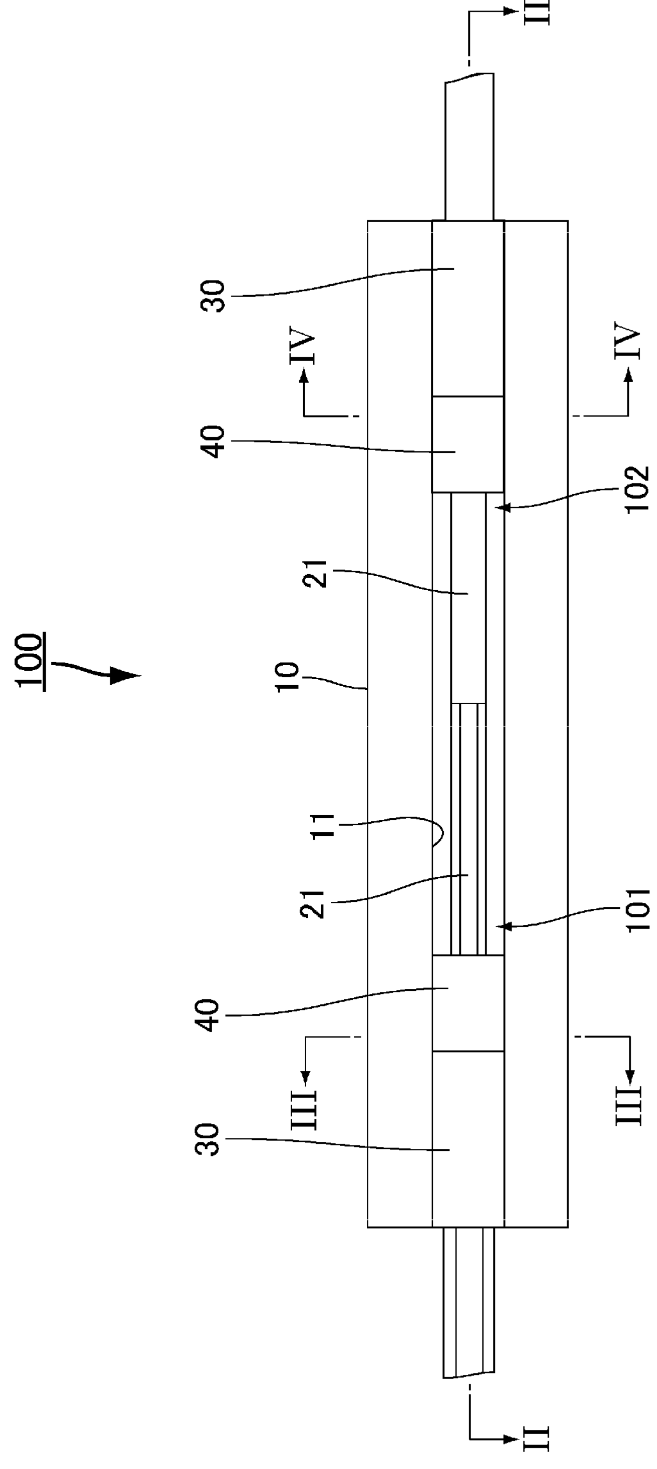
FIG. 1 is a plan view illustrating one or more embodiments of an optical combiner of the present invention.
Figure 3:
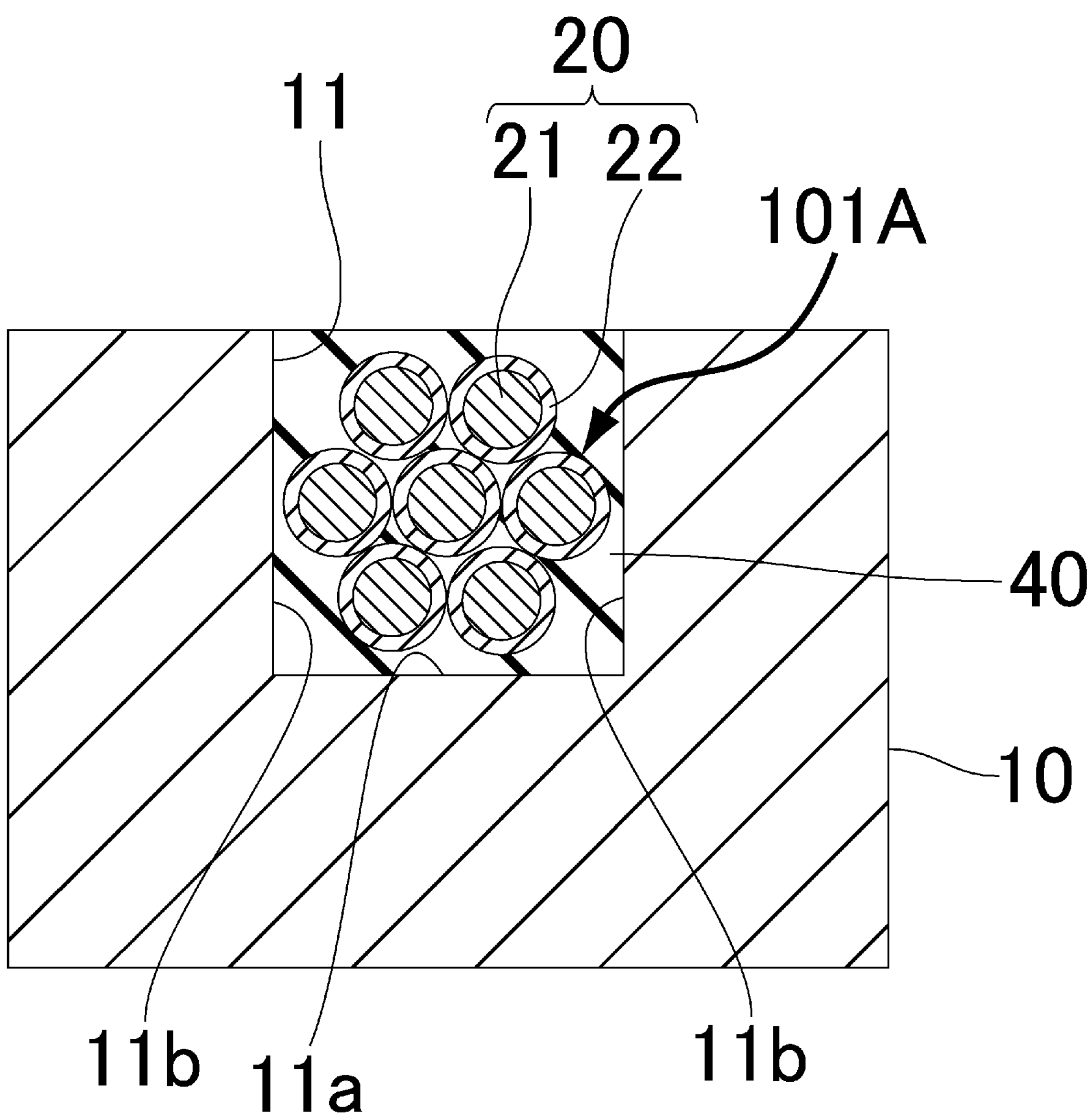
FIG. 3 is a sectional view taken along line III-III in FIG. 1.
Figure 4:
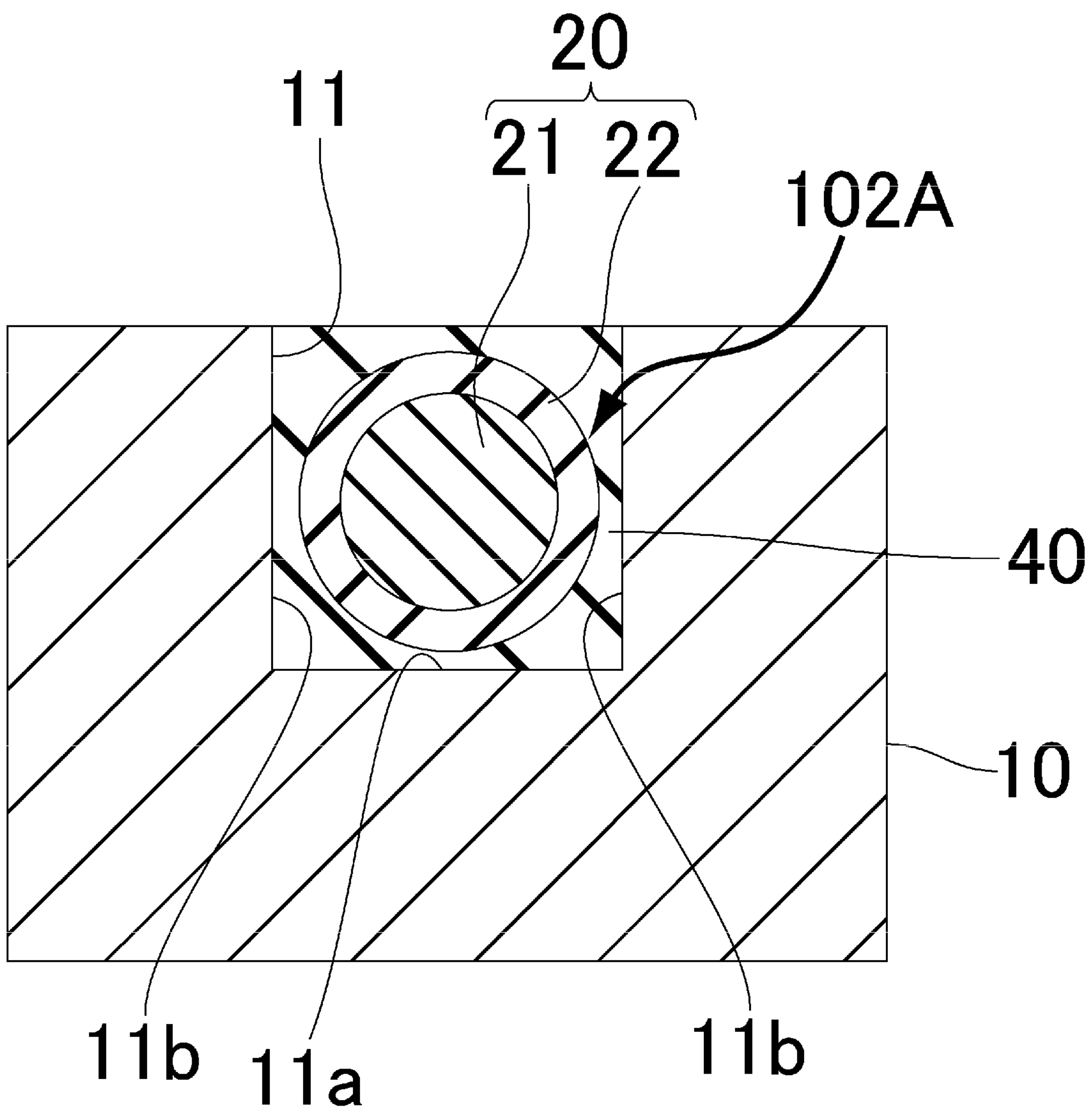
FIG. 4 is a sectional view taken along line IV-IV in FIG. 1.
Figure 5:
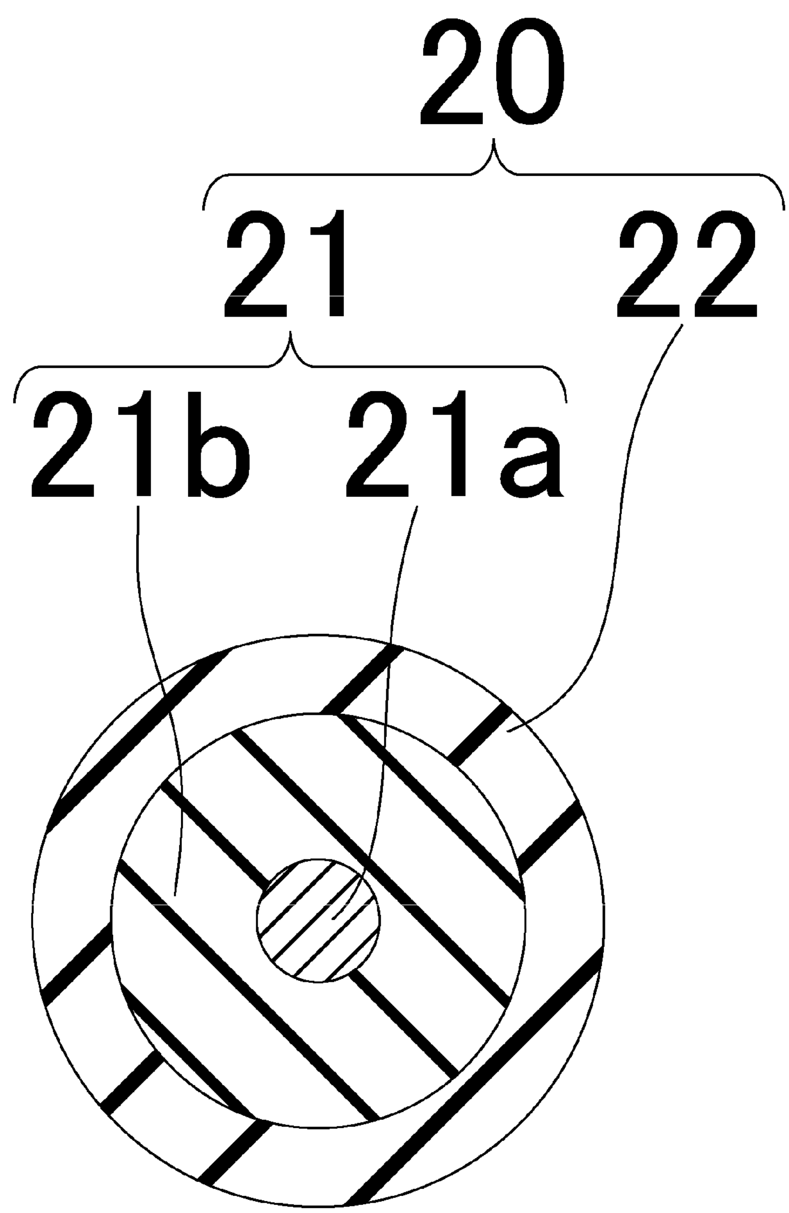
FIG. 5 is an enlarged view illustrating an optical fiber strand of FIG. 3.

Hereinafter, embodiments of an optical combiner of the present invention will be described in detail with reference to FIGS. 1 to 5. FIG. 1 is a plan view illustrating embodiments of an optical combiner of the present invention, FIG. 2 is a partial cut surface end view taken along line II-II of FIG. 1, FIG. 3 is a cross-sectional view taken along line III-III in FIG. 1, FIG. 4 is a sectional view taken along line IV-IV in FIG. 1, and FIG. 5 is an enlarged view illustrating an optical fiber strand of FIG. 3.

Figure 2:
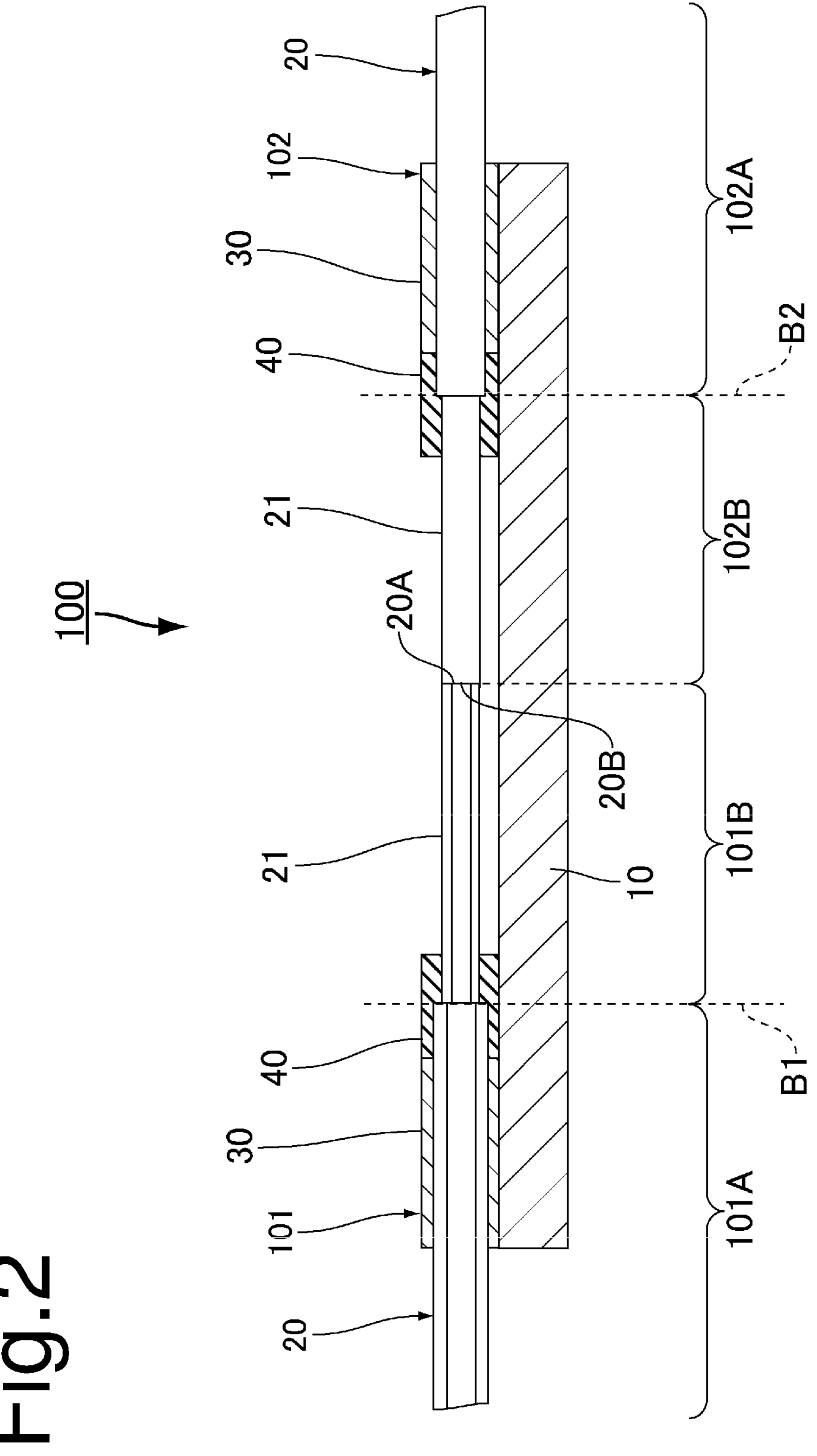
FIG. 2 is a partial cut surface end view taken along line II-II of FIG. 1.

As illustrated in FIGS. 1 and 2, an optical combiner 100 includes a first fiber structure 101, a second fiber structure 102, a housing part 10 having a housing groove 11 housing the first fiber structure 101 and the second fiber structure 102, a first fixing part 30 fixing the first fiber structure 101 to the housing part 10, and a second fixing part 30 fixing the second fiber structure 102 to the housing part 10.

The first fiber structure 101 has a covering part 101A and a strand exposed part 101B adjacent to the covering part 101A. The covering part 101A has a plurality of optical fiber strands 21 and a coating 22 covering each of the plurality of optical fiber strands 21 (see FIG. 3), and the strand exposed part 101B is composed of a plurality of exposed optical fiber strands 21. Here, the plurality of optical fiber strands 21 are optical fiber strands which are common to the covering part 101A and the strand exposed part 101B. That is, an extension part of the optical fiber strand 21 of the covering part 101A is constituted as the optical fiber strand 21 of the strand exposed part 101B. Hereinafter, the optical fiber strands 21 in the covering part 101A and the strand exposed part 101B and the coating 22 in the covering part 101A are collectively referred to as an optical fiber 20.

On the other hand, the second fiber structure 102 has a covering part 102A and a strand exposed part 102B adjacent to the covering part 102A. The covering part 102A has one optical fiber strand 21 and a coating 22 covering one optical fiber strand 21 (see FIG. 4), and the strand exposed part 102B is composed of an exposed optical fiber strand 21. Here, one optical fiber strand 21 is an optical fiber strand common to the covering part 102A and the strand exposed part 102B. That is, an extension part of the optical fiber strand 21 of the covering part 102A is constituted as the optical fiber strand 21 of the strand exposed part 102B. Hereinafter, the optical fiber strand 21 in the covering part 102A and the strand exposed part 102B and the coating 22 in the covering part 102A are also collectively referred to as an optical fiber 20.

The end face of the strand exposed part 101B of the first fiber structure 101 and the end face of the strand exposed part 102B of the second fiber structure 102 are fusion-spliced. As illustrated in FIG. 5, the optical fiber strand 21 has a core 21*a* and a clad 21*b* surrounding the core 21*a*, and the light made incident on the optical combiner 100 passes through the core 21*a* of the optical fiber strand 21 of the first fiber structure 101 and passes through the core 21*a* of the optical fiber strand 21 of the second fiber structure 102. Thus, the first fiber structure 101 and the second fiber structure 102 are housed in the housing groove 11 of the housing part 10 in a state of being optically coupled.

The first fiber structure 101 includes a sealing part 40 covering a boundary B1 between the covering part 101A and the strand exposed part 101B. Here, the boundary B1 refers to a boundary when the first fiber structure 101 is viewed in a plan view. In FIG. 2, the sealing part 40 of the first fiber structure 101 covers one end of the covering part 101A and covers one end of the strand exposed part 101B. Therefore, the sealing part 40 covering one end of the strand exposed part 101B is in contact with the clad 21*b* of the optical fiber strand 21.

On the other hand, the second fiber structure 102 also includes a sealing part 40 covering a boundary B2 between the covering part 102A and the strand exposed part 102B. Here, the boundary B2 refers to a boundary when the second fiber structure 102 is viewed in a plan view. In FIG. 2, the sealing part 40 of the second fiber structure 102 covers one end of the covering part 102A and covers one end of the strand exposed part 102B. Therefore, the sealing part 40 covering one end of the strand exposed part 102B is in contact with the clad 21*b* of the optical fiber strand 21.

The sealing part 40 includes a fluororesin having a structure represented by the following formula (1):

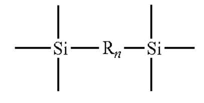
(1)

(In the formula (1), R represents a divalent organic fluorine compound group, and n represents an integer of 1 or more.)

The sealing part 40 is adhered to the bottom surface 11*a* as well as two side surfaces 11*b* extending from both edge parts of the bottom surface 11*a*, of the housing groove 11 of the housing part 10 (see FIGS. 3 and 4).

In the first fiber structure 101 and the second fiber structure 102, the sealing part 40 is adhered to the first fixing part 30 and the second fixing part 30, respectively. Here, the first fixing part 30 and the second fixing part 30 have adhesive strength larger than that of the sealing part 40 with respect to the housing part 10.

According to the optical combiner 100, the sealing part 40 in the first fiber structure 101 contains a fluororesin having a structure represented by the formula (1). Therefore, for example, even if high output light is made incident on the optical fiber strand 21 of the covering part 101A and high output light leaked from the optical fiber strand 21 is made incident on the sealing part 40 for a long time, absorption of high output light by the sealing part 40 is suppressed as compared with a case of using an acrylic resin as the sealing part 40. Therefore, in the first fiber structure 101, thermal deterioration due to temperature rise of the sealing part 40 is suppressed, and deterioration of sealing performance of the sealing part 40 is suppressed. Therefore, it is suppressed that moisture enters from a boundary B1 between the strand exposed part 101B and the covering part 101A, and the optical fiber strand 21 is pressed by the swelling of the coating 22 due to the moisture to deteriorate the optical characteristics of the optical fiber strand 21.

In the optical combiner 100, the sealing part 40 in the second fiber structure 102 contains a fluororesin having a structure represented by the formula (1). Therefore, even if the high output light is made incident on the optical fiber strand 21 of the strand exposed part 102B from the strand exposed part 101B of the first fiber structure 101 and the high output light leaked from the optical fiber strand 21 is made incident on the sealing part 40 for a long time, the absorption of the high output light by the sealing part 40 is suppressed as compared with the case of using the acrylic resin as the sealing part 40. Therefore, in the second fiber structure 102, thermal deterioration due to temperature rise of the sealing part 40 is suppressed, and deterioration of sealing performance of the sealing part 40 is suppressed. Therefore, it is suppressed that moisture enters from a boundary B2 between the strand exposed part 102B and the covering part 102A, and the optical fiber strand 21 is pressed by the swelling of the coating 22 due to the moisture to deteriorate the optical characteristics of the optical fiber strand 21.

Therefore, the durability of the first fiber structure 101 and the second fiber structure 102 can be improved. Therefore, the durability of the optical combiner 100 can be improved.

In the first fiber structure 101 and the second fiber structure 102, the sealing part 40 is adhered to the first fixing part 30 and the second fixing part 30, respectively, and the first fixing part 30 and the second fixing part 30 have adhesive strength larger than that of the sealing part 40 with respect to the housing part 10.

Thus, the first fiber structure 101 and the second fiber structure 102 are fixed to the housing part 10 by the first fixing part 30 and the second fixing part 30 having adhesive strength larger than that of the sealing part 40 with respect to the housing part 10, thereby reinforcing the fixing of the first fiber structure 101 and the second fiber structure 102 to the housing part 10. Therefore, separation of the first fiber structure 101 and the second fiber structure 102 from the housing part 10 can be suppressed.

The sealing part 40 of the first fiber structure 101 is fixed to the bottom surface 11*a* of the housing groove 11 of the housing part 10, and the sealing part 40 of the second fiber structure 102 is fixed to two side surfaces 11*b* extending from both edge parts of the bottom surface 11*a* of the housing groove 11 of the housing part 10. Therefore, the adhesive strength of the first fiber structure 101 and the housing part 10 and the adhesive strength of the second fiber structure 102 and the housing part 10 can be further enhanced.

Next, the housing part 10, the optical fiber 20, the first fixing part 30, the second fixing part 30, and the sealing part 40 in the optical combiner 100 will be described in detail.

(Housing Part)

The material constituting the housing part 10 is not particularly limited, but may be either a resin or an inorganic material. However, it may be composed of an inorganic material. In this case, since the inorganic material is harder than the resin, the first fiber structure 101 and the second fiber structure 102 can be protected from external force, impact and vibration. Since the thermal expansion coefficient of the inorganic material is smaller than that of the resin, thermal expansion or thermal contraction due to a change in the ambient temperature environment is suppressed, generation of microbend in the optical fiber 20 is suppressed, and deterioration of optical characteristics in the optical fiber 20 can be suppressed. Examples of such an inorganic material include glass materials such as Neoceram (Registered trademark) or quartz.

(Optical Fiber)

The optical fiber 20 has an optical fiber strand 21 and a coating 22. Here, the coating 22 may be composed of a material having a refractive index smaller than that of the clad 21*b* of the optical fiber strand 21. Examples of the material constituting the coating 22 include a silicon resin and a polyamide resin.

(First Fixing Part and Second Fixing Part)

The first fixing part 30 and the second fixing part 30 may be made of a material capable of fixing the first fiber structure 101 and the second fiber structure 102 to the housing part 10. Examples of the material constituting the first fixing part 30 and the second fixing part 30 include a silicon resin and an epoxy resin.

(Sealing Part)

The sealing part 40 contains a fluororesin having a structure represented by the formula (1). The fluorine resin can be obtained by crosslinking a crosslinkable compound containing a structure represented by the following formula (2) in the main chain by ultraviolet or heating.

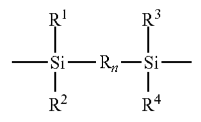

(2)

(In the formula (2), R represents a divalent organic fluorine compound group, and n represents an integer of 1 or more. $R^1$ to $R^4$ each independently represent an organic group.)

R in the formulae (1) and (2) may be a divalent organic fluorine compound group. The divalent organic fluorine compound group may be a group represented by the following formula (A):

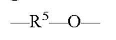

$$-R^5-O- \quad (A)$$

(In the formula (A), $R^5$ represents a fluorinated alkylene group having 1 to 5 carbon atoms.

In this case, since the sealing part 40 has an Si—O bond having a bonding energy larger than that of a C—C bond or a C—H bond, the heat resistance of the sealing part 40 is further improved, and the durability of the first fiber structure 101 and the second fiber structure 102 can be further improved.

The fluorinated alkylene group may be any one in which at least a part of the hydrogen atom of the alkylene group is substituted with a fluorine atom, but all hydrogen atoms in the alkylene group may be substituted with fluorine atoms. The fluorinated alkylene group may be $-CF_2-CF(CF_3)-$, $-CF_2-$, $-CF_2-CF_2-$ or $-CF_2-CF_2-CF_2-$.

In this case, since the sealing part 40 has a C—F bond and an Si—O bond having binding energy larger than a C—C bond and a C—H bond, the heat resistance of the sealing part 40 is further improved, and the durability of the first fiber structure 101 and the second fiber structure 102 can be further improved. In a case where a plurality of R is included in the fluororesin, the plurality of R may be the same or different.

Examples of the organic group represented by $R^1$ to $R^4$ in the formula (2) include a group having $CH_2=CH-$ structure at its terminal, such as a vinyl group, an allyl group, a propenyl group, an isopropenyl group, a butenyl group, and a hexenyl group, and a hydrocarbon group such as an alkyl group.

In a case where the sealing part 40 contains the fluororesin, the following experiment was performed in order to confirm that the absorption of light is suppressed for a long time in a high temperature environment as compared with the case where the sealing part 40 is an acrylic resin.

That is, a cross-linking compound (product name "SIFEL", manufactured by Shin-Etsu Chemical Industries Co. Ltd.) where R in the formula (2) is $-CF_2-CF(CF_3)-O-$ is crosslinked to prepare a sheet having a thickness of 0.5 mm. On the other hand, a sheet having a thickness of 0.5 mm is prepared in the same manner as the acrylic resin for comparison. The light transmittances when these sheets are stored at 150° C. were measured, respectively and changes over time of the light transmittances at a wavelength of 1070 nm were measured. The results are shown in Table 1, Table 2 and FIG. 6. At this time, an ultraviolet visible near infrared spectrophotometer (product name "V-600", manufactured by Japan Spectroscopic Co. Ltd.) was used for measurement. The increase amounts of the light absorption rates when the light absorption rate (=100−light transmittance) at 0 hour was used as a reference were also measured. The results are shown in Table 1, Table 2 and FIG. 7.

TABLE 1

| | Storage time at 150° C. | | | |
|---|---|---|---|---|
| | 0 | 258 | 570 | 879 |
| Light transmittance of fluororesin (%) | 99.23 | 99.18 | 99.52 | 99.02 |
| Increase amount in light absorption rate (%) (Referene: 0 hour) | 0.00 | 0.05 | −0.29 | 0.21 |

TABLE 2

| | Storage time at 150° C. | | | |
|---|---|---|---|---|
| | 0 | 312 | 600 | 900 |
| Light transmittance of acrylic resin (%) | 96.65 | 94.52 | 93.76 | 91.34 |
| Increase amount in light absorption rate (%) (Referene: 0 hour) | 0.00 | 2.13 | 2.88 | 5.30 |

Figure 6:
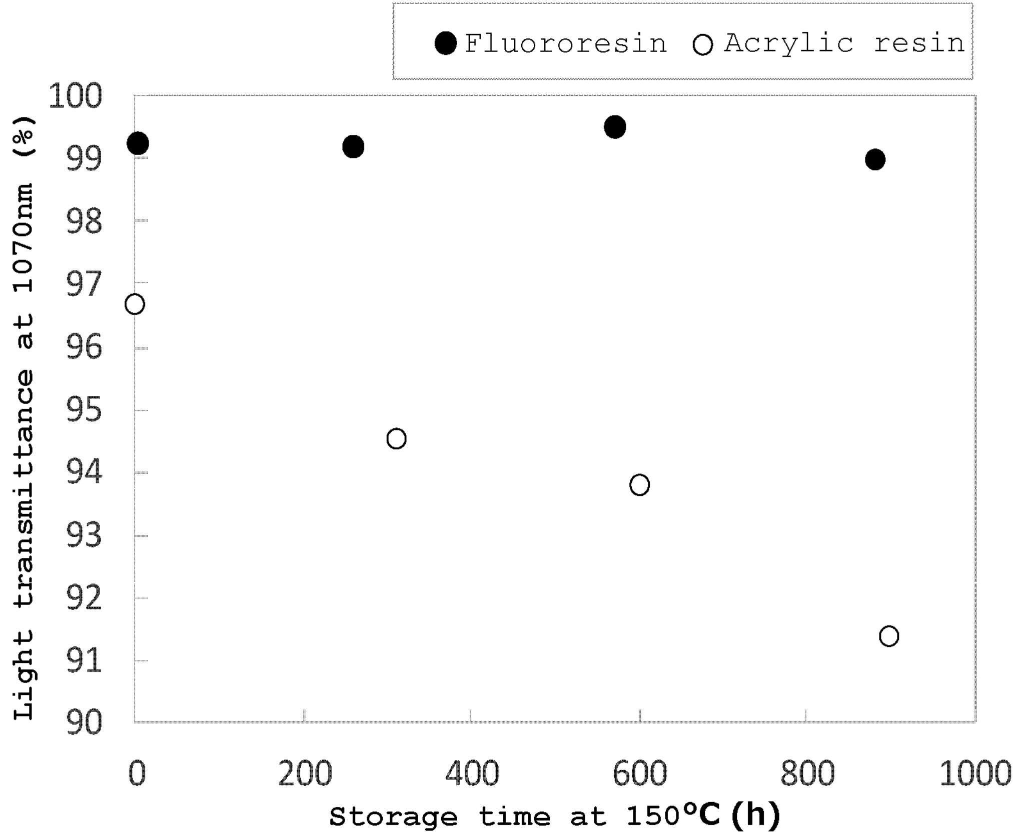
FIG. 6 is a graph illustrating changes over time in light transmittance at 150° C. of a sheet made of a fluororesin having a structure represented by formula (1) and a sheet made of an acrylic resin.
Figure 7:
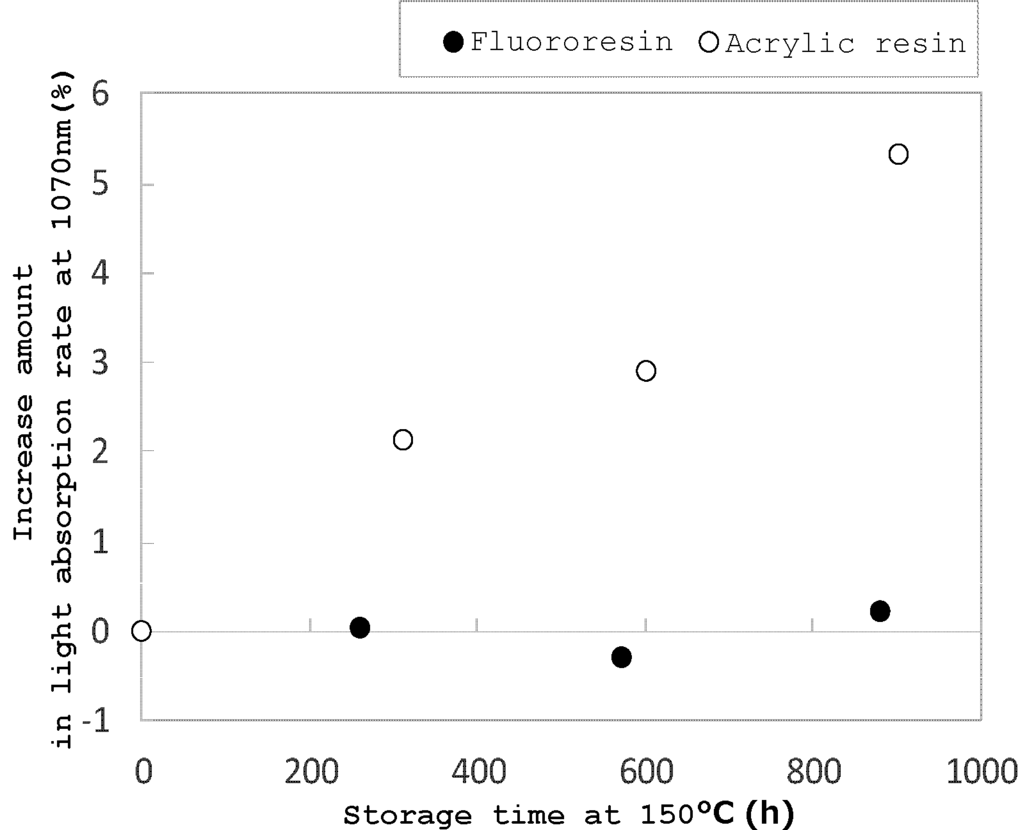
FIG. 7 is a graph illustrating changes over time in an increase amount of a light absorption rate at 150° C. of a sheet made of a fluororesin having a structure represented by formula (1) and a sheet made of an acrylic resin.

From the results shown in Table 1, Table 2 and FIG. 6, it can be seen that the fluororesin is kept high in light transmittance unlike the acrylic resin even if the fluororesin is stored at a high temperature of 150° C. for a long period of time. From the results shown in Table 1, Table 2 and FIG. 7, it can be seen that the amount of increase in the light absorption rate of the fluororesin is sufficiently smaller than that of the acrylic resin even after the lapse of a time longer than about 900 hours. Here, the increase amount of the light absorption rate indicates the degree of deterioration by the heat of the sealing part 40.

Therefore, as described above, in a case where the sealing part 40 contains the fluorine resin, it can be seen that absorption of light is suppressed for a long time in a high temperature environment as compared with a case where the sealing part 40 is an acrylic resin.

The content of the fluororesin in the sealing part 40 is not particularly limited, but is usually 50 mass % or more. From the viewpoint of improving the sealing performance, the content of the fluororesin in the sealing part 40 may be 80 mass % or more, and particularly may be 100 mass %.

The refractive index of the sealing part 40 is not particularly limited, but it may be smaller than that of the clad 21*b*. In this case, light can be confined in the optical fiber strand 21.

The Young's modulus of the sealing part 40 is not particularly limited, but may be 10 MPa or less.

In this case, when light is made incident on the first fiber structure 101 of the optical combiner 100 and is emitted from the second fiber structure 102 of the optical combiner 100, the beam quality of the emitted light can be further improved as compared with the case where the Young's modulus of the sealing part 40 exceeds 10 MPa.

The Young's modulus of the sealing part 40 may be 10 MPa or less, and may be 1 MPa or less.

However, for the reason of maintaining the shape of the sealing part 40, the Young's modulus of the sealing part 40 may be 1 kPa or more. The Young's modulus of the sealing part 40 may be 1 kPa or more, and may be 5 kPa or more. The Young's modulus is a value at room temperature (23° C.)

Next, a method of manufacturing the optical combiner 100 will be described.

First, a plurality of coated optical fibers obtained by coating an optical fiber strand 21 with a coating over the entire length are prepared, and only the coating is removed from the end parts of the plurality of coated optical fibers to obtain an optical fiber 20. Then, the part of the exposed optical fiber strand 21 of the optical fiber 20 is bundled to form the strand exposed part 101B, and the part of the optical fiber strand 21 covered with the coating 22 is bundled to form the covering part 101A. Thus, the first optical fiber part is prepared.

On the other hand, the optical fiber 20 is obtained in the same manner as the first optical fiber part. At this time, the exposed optical fiber strand 21 of the optical fiber 20 serves as the strand exposed part 102B, and the optical fiber strand 21 covered with the coating 22 serves as the covering part 102A. Thus, the second optical fiber part is prepared.

The end face 20A of the strand exposed part 101B of the first optical fiber part and the end face 20B of the strand exposed part B of the second optical fiber part are fusion-spliced to form a fiber connection body.

Next, a housing part 10 having a housing groove 11 is prepared, and the above-described fiber connection body is housed in the housing groove 11.

Next, the above-described first optical fiber part is fixed to the housing part 10 by the first fixing part 30, and the above-described second optical fiber part is fixed to the housing part 10 by the second fixing part 30.

Next, a crosslinkable compound serving as a precursor of the sealing part 40 is applied so as to cover a boundary B1 between the covering part 101A of the first optical fiber part and the strand exposed part 101B. At this time, the precursor of the sealing part 40 is applied so as to be in contact with two side faces 11*b* extending from both edge parts of the bottom face 11*a* and the bottom face 11*a* of the housing groove 11 as well as the first fixing part 30. Thereafter, the crosslinkable compound is crosslinked by, for example, heating or ultraviolet rays. Thus, the sealing part 40 is formed, and the first fiber structure 101 is obtained. At this time, the sealing part 40 is adhered to the bottom surface 11*a* and the two side surfaces 11*b* of the housing groove 11 as well as the first fixing part 30.

Then, a crosslinkable compound serving as a precursor of the sealing part 40 is applied so as to cover a boundary B2 between the covering part 102A of the second optical fiber part and the strand exposed part 102B. At this time, the precursor of the sealing part 40 is applied so as to be in contact with two side surfaces 11*b* extending from both edge parts of the bottom surface 11*a* and the bottom surface 11*a* of the housing groove 11 as well as the second fixing part 30. Thereafter, the crosslinkable compound is crosslinked by, for example, heating or ultraviolet rays. Thus, the sealing part 40 is formed and the second fiber structure 102 is obtained. At this time, the sealing part 40 is adhered to the bottom surface 11*a* and the two side surfaces 11*b* of the housing groove 11 as well as the second fixing part 30.

In a manner as described above, the optical combiner 100 is obtained.

When the first fiber structure 101 and the second fiber structure 102 are obtained, the crosslinkable compound is usually liquid, and therefore can be easily applied even in a narrow space in the housing groove 11. Since curing shrinkage during curing is small in comparison with an acrylic resin or the like in the crosslinkable compound, bending deformation applied to the optical fiber 20 during curing can be reduced, and deterioration of the quality of the beam emitted from the obtained optical combiner 100 can be suppressed.

<Laser Light Source>

Figure 8:
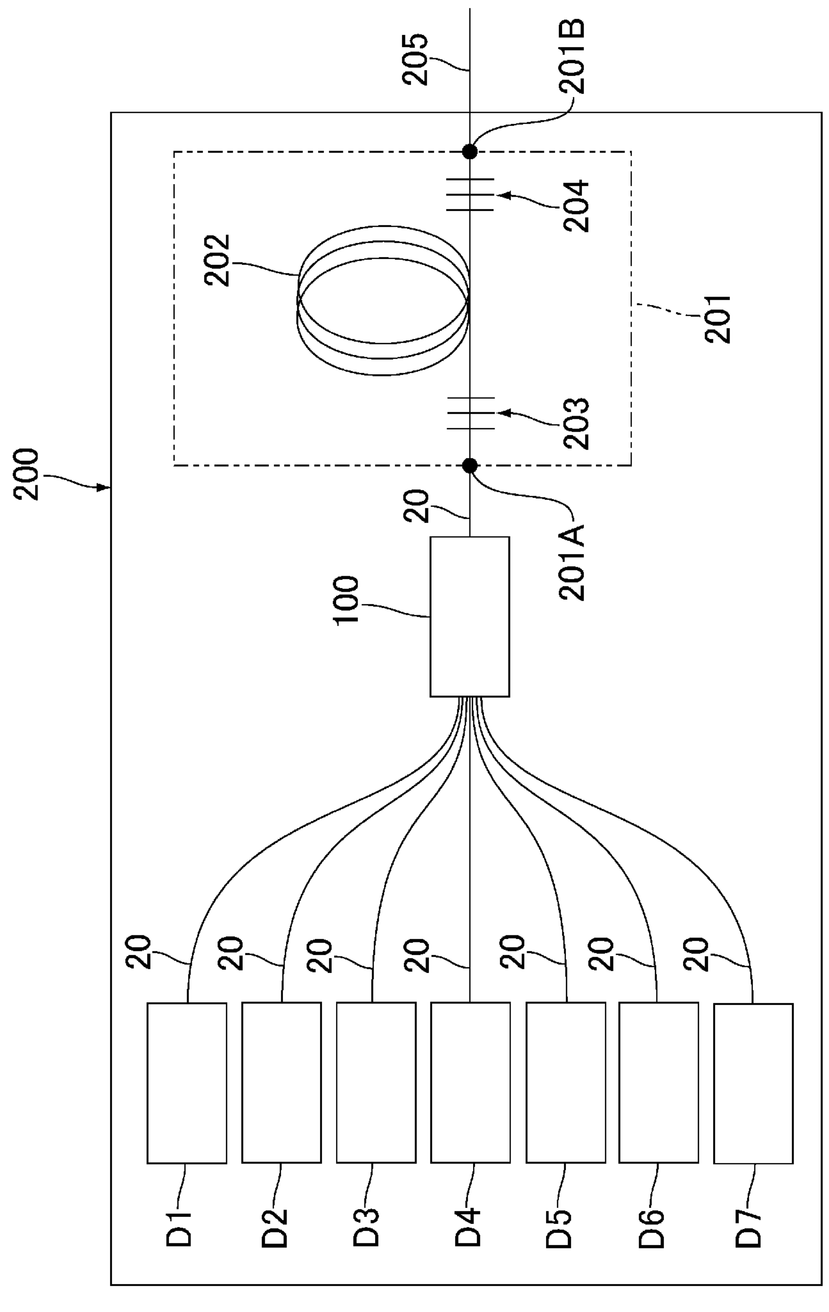
FIG. 8 is a schematic diagram illustrating one or more embodiments of a laser light source of the present invention.

Next, embodiments of a laser light source of the present invention will be described with reference to FIG. 8. FIG. 8 is a schematic view illustrating one or more embodiments of the laser light source of the present invention.

As illustrated in FIG. 8, a laser light source 200 includes an optical combiner 100, an optical resonance part 201 emitting light of a specific wavelength as a laser light on the basis of light emitted from an optical fiber strand 21 of a second fiber structure 102 of the optical combiner 100, excitation light sources D1 to D7 making excitation light incident on each of the optical fiber strands 21 of the plurality of optical fibers 20 of the first fiber structure 101 of the optical combiner 100, and an output fiber 205 outputting light emitted as laser light from the optical resonance part 201.

According to the laser light source 200, excitation light is made incident on each of the optical fiber strands 21 of the plurality of optical fibers 20 of the first fiber structure 101 of the optical combiner 100 from the excitation light sources D1 to D7, and light of a specific wavelength is emitted as laser light from the optical resonance part 201 on the basis of the light emitted from the optical fiber strand 21 of the optical fiber 20 of the second fiber structure 102 of the optical combiner 100, and the laser light is output from the output fiber 205. At this time, as described above, the optical combiner 100 can improve the durability. Therefore, the durability of the laser light source 200 can be improved.

The excitation light sources D1 to D7 may be anything emitting excitation light, and as the excitation light sources D1 to D7, for example, a laser diode or the like can be used.

The optical resonance part 201 includes an optical fiber 202 for amplification, a first reflection part 203 provided at one end of the optical fiber, and a second reflection part 204 provided at the other end of the optical fiber. The first reflection part 203 is connected to the optical fiber 20 of the second fiber structure 102 of the optical combiner 100 at the input part 201A, and the second reflection part 204 is connected to the output fiber 205 at the output part 201B. In the optical resonance part 201, spontaneous emission light is generated by the incident excitation light, induced emission of light is generated by light having a specific wavelength selectively reflected by the first reflection part 203 and the second reflection part 204 out of the generated spontaneous emission light as a seed, and the light of a specific wavelength is output as a laser light by repeating the induced emission.

The first reflection part 203 and the second reflection part 204 are composed of, for example, a fiber Bragg grating (FBG) or the like.

The optical fiber 202 for amplification is composed of rare earth element-added optical fiber. The rare earth element is not particularly limited, but, for example, ytterbium (Yb) or the like is used as the rare earth element.

The number of excitation light sources D1 to D7 is seven, but is not limited to seven. The number can be appropriately changed in accordance with the number of optical fibers 20 included in the first fiber structure 101 of the optical combiner.

<Laser Device>

Figure 9:
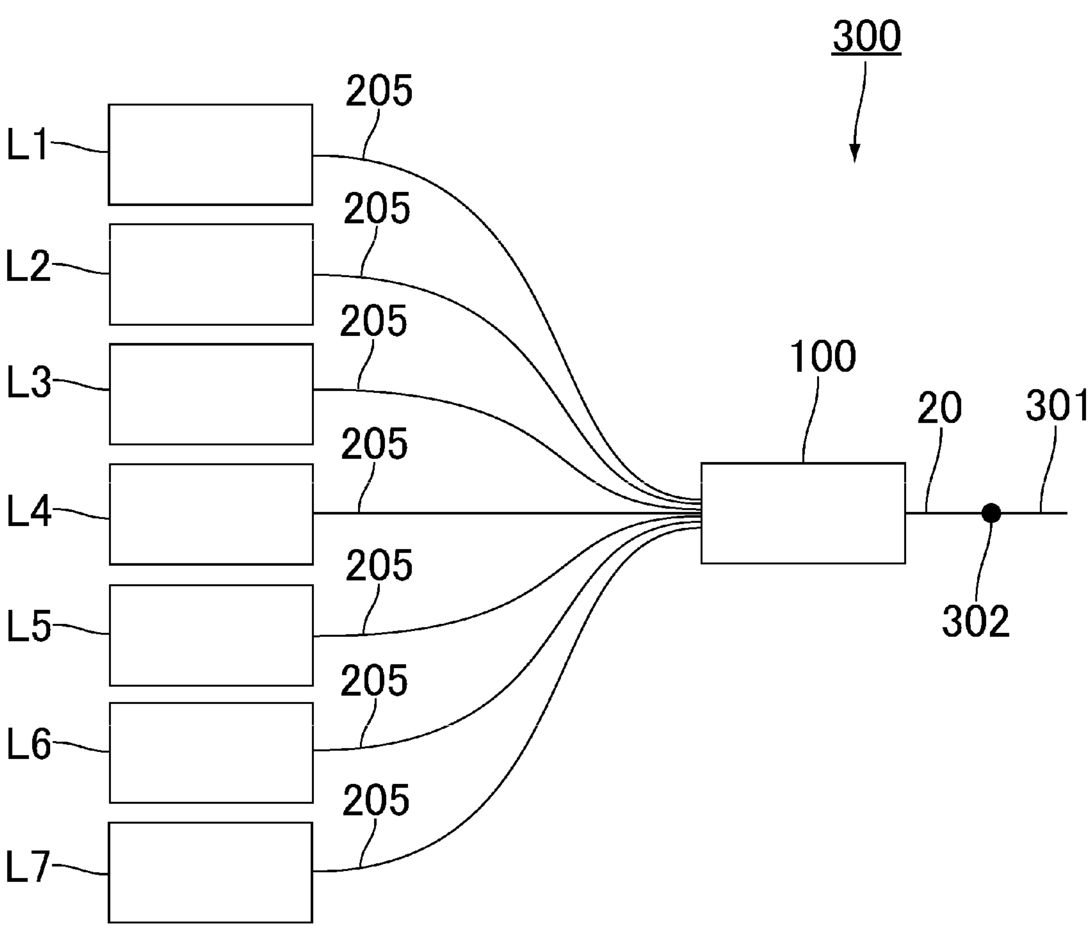
FIG. 9 is a schematic diagram illustrating one or more embodiments of the laser device of the present invention.

Next, embodiments of the laser device of the present invention will be described with reference to FIG. 9. FIG. 9 is a schematic diagram illustrating embodiments of the laser device of the present invention.

As illustrated in FIG. 9, the laser device 300 includes a plurality of laser light sources L1 to L7, an optical combiner 100 combining and outputting laser lights made incident from the plurality of laser light sources L1 to L7, and an output fiber 301 connected to the optical fiber 20 of the second fiber structure 102 of the optical combiner 100 by a connection part 302.

According to the laser device 300, the laser lights are made incident on the first fiber structure 101 of the optical combiner 100 from the plurality of laser light sources L1 to L7, coupled and emitted from the optical fiber 20 of the second fiber structure 102, and the emitted light is output from the output fiber 301. At this time, the optical combiner 100 can improve the durability as described above. Therefore, the durability of the laser device 300 can be improved.

In the laser device 300, the laser light sources L1 to L7 may be anything if they are laser light source, and examples of the laser light sources L1 to L7 include, for example, a laser diode, a $CO_2$ laser, a YAG laser, and the laser light source 200 described above. Among them, the laser light sources L1 to L7 may be composed of the laser light source 200 described above. In this case, the output fiber 205 of the laser light source 200 is connected to the optical fiber 20 of the first fiber structure 101 of the optical combiner 100.

In this case, the laser light sources L1 to L7 are composed of the laser light sources 200 described above, and has the optical combiner 100 capable of improving durability. Therefore, the laser device 300 can further improve the durability.

Figure 10:
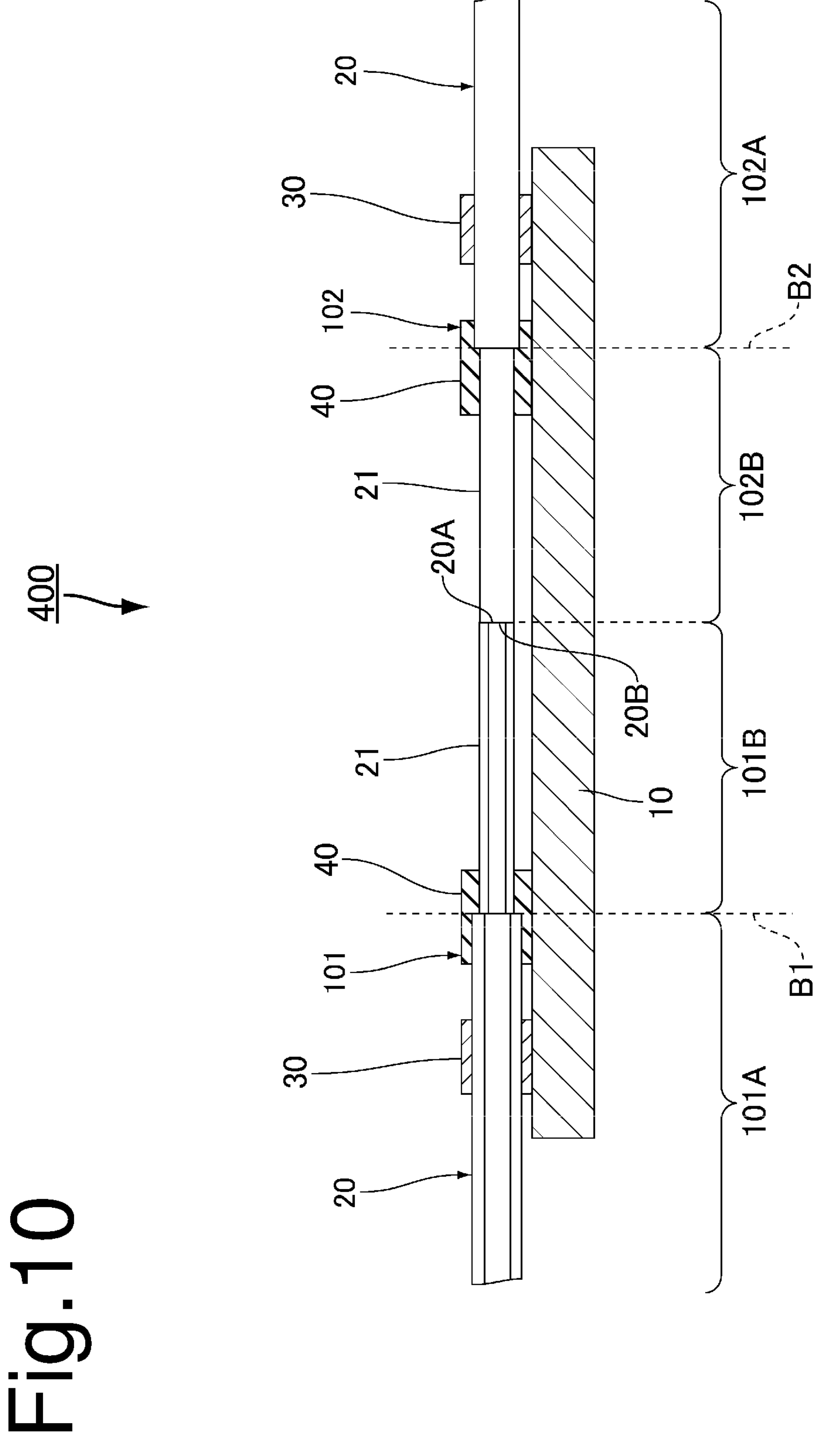
FIG. 10 is a partial cut surface end view illustrating one or more embodiments of the optical combiner of the present invention.

The present invention is not limited to the above-described one or more embodiments. For example, in the above embodiments, the first fixing part 30 and the second fixing part 30 are adhered to the sealing part 40, but the first fixing part 30 and the second fixing part 30 may be separated from the sealing part 40, respectively, as in the optical combiner 400 illustrated in FIG. 10.

In the above one or more embodiments, the sealing part 40 of the first fiber structure 101 and the sealing part 40 of the second fiber structure 102 are both fixed to the housing part 10, but any one or both of the sealing part 40 of the first fiber structure 101 and the sealing part 40 of the second fiber structure 102 may not be fixed to the housing part 10.

Further, in the above one or more embodiments, the first fixing part 30 and the second fixing part 30 each have an adhesive strength larger than that of the sealing part 40 with respect to the housing part 10, but the first fixing part 30 and the second fixing part 30 each may have an adhesive strength equal to or less than the sealing part 40 with respect to the housing part 10.

In the above one or more embodiments, the first fixing part 30 and the second fixing part 30 may be omitted.

Further, in the above one or more embodiments, the optical combiner 100 has a housing part 10, but the housing part 10 may be omitted.

In the above one or more embodiments, the sealing part 40 is adhered to the bottom surface 11*a* and the two side surfaces 11*b* of the housing groove 11, but may not be adhered to the bottom surface 11*a* of the housing groove 11, or may be separated from the housing groove 11. Alternatively, the sealing part 40 may be adhered only to the bottom surface 11*a* and may not be adhered to the side surface 11*b*.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

10 Housing part

20A End face of strand exposed part of first fiber structure

20B End face of strand exposed part of second fiber structure
21 Optical fiber strand
21*a* CORE
21*b* Clad
22 Coating
30 First fixing part, second fixing part
40 Sealing part
100, 400 Optical combiner
101 First fiber structure
102 Second fiber structure
200 Laser light source
201 Optical resonance part
300 Laser device
301 Fiber for output
101A, 102A Covering part
101B, 102B Strand exposed part
B1, B2 Boundary between covering part and strand exposed part
D1 to D7 Excitation light source
L1 to L7 Laser light source

The invention claimed is:

1. A fiber structure, comprising:
a covering part, the covering part having an optical fiber strand and a coating covering the optical fiber strand,
a strand exposed part adjacent to the covering part, the strand exposed part including an exposed optical fiber strand, and
a sealing part covering a boundary between the covering part and the strand exposed part, the sealing part including a fluororesin having a structure represented by formula (1):

(1)

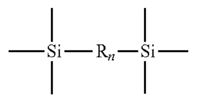

where R represents a divalent organic fluorine compound group, and n represents an integer of 1 or more.

2. The fiber structure according to claim 1, wherein the divalent organic fluorine compound group is represented by formula (A):

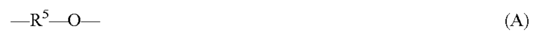

$—R^5—O—$ (A)

wherein $R^5$ represents a fluorinated alkylene group having 1 to 5 carbon atoms.

3. The fiber structure according to claim 2, wherein the fluorinated alkylene group is $—CF_2—CF(CF_3)—$, $—CF_2—$, $—CF_2—CF_2—$ or $—CF_2—CF_2—CF_2—$.

4. The fiber structure according to claim 1,
wherein the optical fiber strand has a core and a clad surrounding the core, and
wherein a refractive index of the sealing part is smaller than a refractive index of the clad.

5. An optical combiner, comprising:
a first fiber structure and a second fiber structure,
wherein the first fiber structure and the second fiber structure each comprises:
a covering part, the covering part having an optical fiber strand and a coating covering the optical fiber strand,
a strand exposed part adjacent to the covering part, the strand exposed part including an exposed optical fiber strand, and
a sealing part covering a boundary between the covering part and the strand exposed part, the sealing part including a fluororesin having a structure represented by formula (1):

(1)

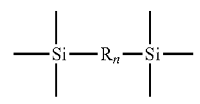

where R represents a divalent organic fluorine compound group, and n represents an integer of 1 or more,
wherein in the first fiber structure, the covering part and the strand exposed part have a plurality of the optical fiber strands,
wherein in the second fiber structure, the covering part and the strand exposed part have one optical fiber strand, and
wherein an end face of the strand exposed part of the first fiber structure and an end face of the strand exposed part of the second fiber structure are fusion-spliced.

6. The optical combiner according to claim 5, wherein the sealing part has a Young's modulus of 10 MPa or less.

7. The optical combiner according to claim 5, further comprising:
a housing part housing the first fiber structure and the second fiber structure,
a first fixing part fixing the first fiber structure to the housing part, and
a second fixing part fixing the second fiber structure to the housing part,
wherein in the first fiber structure, the first fixing part is adhered to the sealing part,
wherein in the second fiber structure, the second fixing part is adhered to the sealing part, and
wherein the first fixing part and the second fixing part each have an adhesive strength larger than that of the sealing part with respect to the housing part.

8. The optical combiner according to claim 5, further comprising:
a housing part housing the first fiber structure and the second fiber structure,
wherein the sealing part of the first fiber structure is fixed to the housing part, and the sealing part of the second fiber structure is fixed to the housing part.

9. A laser light source, comprising:
the optical combiner according to claim 5,
an optical resonance part emitting light of a specific wavelength as a laser light on basis of light emitted from the optical fiber strand of the second fiber structure of the optical combiner, and
an excitation light source making excitation light incident on each of a plurality of the optical fiber strands of the first fiber structure of the optical combiner.

10. A laser device, comprising:
a plurality of laser light sources, and
an other optical combiner coupling and emitting a laser light made incident from the plurality of laser light sources,
wherein the other optical combiner includes the optical combiner according to claim 5.

11. The laser device according to claim 10, wherein each of the laser light sources comprises:
the optical combiner, an optical resonance part emitting light of a specific wavelength as a laser light on basis of light emitted from the optical fiber strand of the second fiber structure of the optical combiner, and an excitation light source making excitation light incident on each of a plurality of the optical fiber strands of the first fiber structure of the optical combiner.

* * * * *